United States Patent
Bogi et al.

(10) Patent No.: US 11,923,844 B2
(45) Date of Patent: Mar. 5, 2024

(54) GATE BIAS STABILIZATION TECHNIQUES

(71) Applicant: Arm Limited, Cambridge (GB)

(72) Inventors: Seshagiri Rao Bogi, Vizianagaram (IN); Vinay Chenani, Bangalore (IN); Gurupadayya Shidaganti, Hubli (IN); Akshaykumar V Jabi, Hubli (IN)

(73) Assignee: Arm Limited, Cambridge (GB)

( * ) Notice: Subject to any disclaimer, the term of this patent is extended or adjusted under 35 U.S.C. 154(b) by 127 days.

(21) Appl. No.: 17/731,846

(22) Filed: Apr. 28, 2022

(65) Prior Publication Data

US 2023/0353150 A1    Nov. 2, 2023

(51) Int. Cl.
| | | |
|---|---|---|
| H03K 19/0185 | (2006.01) | |
| H03K 3/356 | (2006.01) | |
| H03K 17/081 | (2006.01) | |
| H03K 19/003 | (2006.01) | |
| H03K 19/007 | (2006.01) | |

(52) U.S. Cl.
CPC ..... *H03K 19/007* (2013.01); *H03K 3/356113* (2013.01); *H03K 17/08104* (2013.01); *H03K 19/00315* (2013.01)

(58) Field of Classification Search
CPC ....... H03K 3/356113; H03K 17/08104; H03K 19/00315; H03K 19/007
See application file for complete search history.

(56) References Cited

U.S. PATENT DOCUMENTS

| | | | |
|---|---|---|---|
| 6,970,024 B1* | 11/2005 | Reese | H03K 19/00315 327/112 |
| 11,418,189 B2* | 8/2022 | Singrigowda | H01L 27/0922 |
| 2014/0002146 A1* | 1/2014 | Kim | H03K 19/018521 327/333 |
| 2021/0208615 A1* | 7/2021 | Bogi | G05F 1/575 |
| 2022/0231686 A1* | 7/2022 | Lee | H03K 19/018521 |
| 2023/0133850 A1* | 5/2023 | Bogi | H03K 19/00315 326/81 |

* cited by examiner

*Primary Examiner* — Kurtis R Bahr
(74) *Attorney, Agent, or Firm* — Pramudji Law Group PLLC; Ari Pramudji

(57) ABSTRACT

Various implementations described herein are related to a device having a level shifter that receives an input signal and reference voltages and provides level-shifted input signals based on the reference voltages. The device may have a pre-driver that receives the level-shifted input signals and reference voltages and provides gate voltages based on the reference voltages. The device may have a gate stabilizer that receives the reference voltages and provides a stabilized reference voltage based on the reference voltages. The device may have an output driver that receives the reference voltages, receives the gate voltages, receives the stabilized reference voltage and provides an output pad voltage to an input-output pad based on the reference voltages, the gate voltages and the stabilized reference voltage.

20 Claims, 4 Drawing Sheets

REFGEN Generated Reference REFP = ( DVDD − REFN )

REFGEN Generated Reference REFN = max ( DVDDLO, DVDD/2 )

Technology Limit (maximum allowable voltage) : 1.8V

GATE BIAS STABILIZATION TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some computing architecture, overdrive fail-safe/tolerant operations refer to electronic circuits that are designed to prevent unsafe operation of controlled components in the event of failure of one or more internal circuit components. Therefore, fail-safe/tolerant circuits are designed to mitigate failure when failures occur. In reference to control logic, safe circuit operation may involve safely performing tasks, and in electrical engineering, fail-safes and tolerant behaviors are typically designed to implement features or practices that respond to and mitigate specific types of failures that can cause excessive to minimal to no-harm for some internal circuit components.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
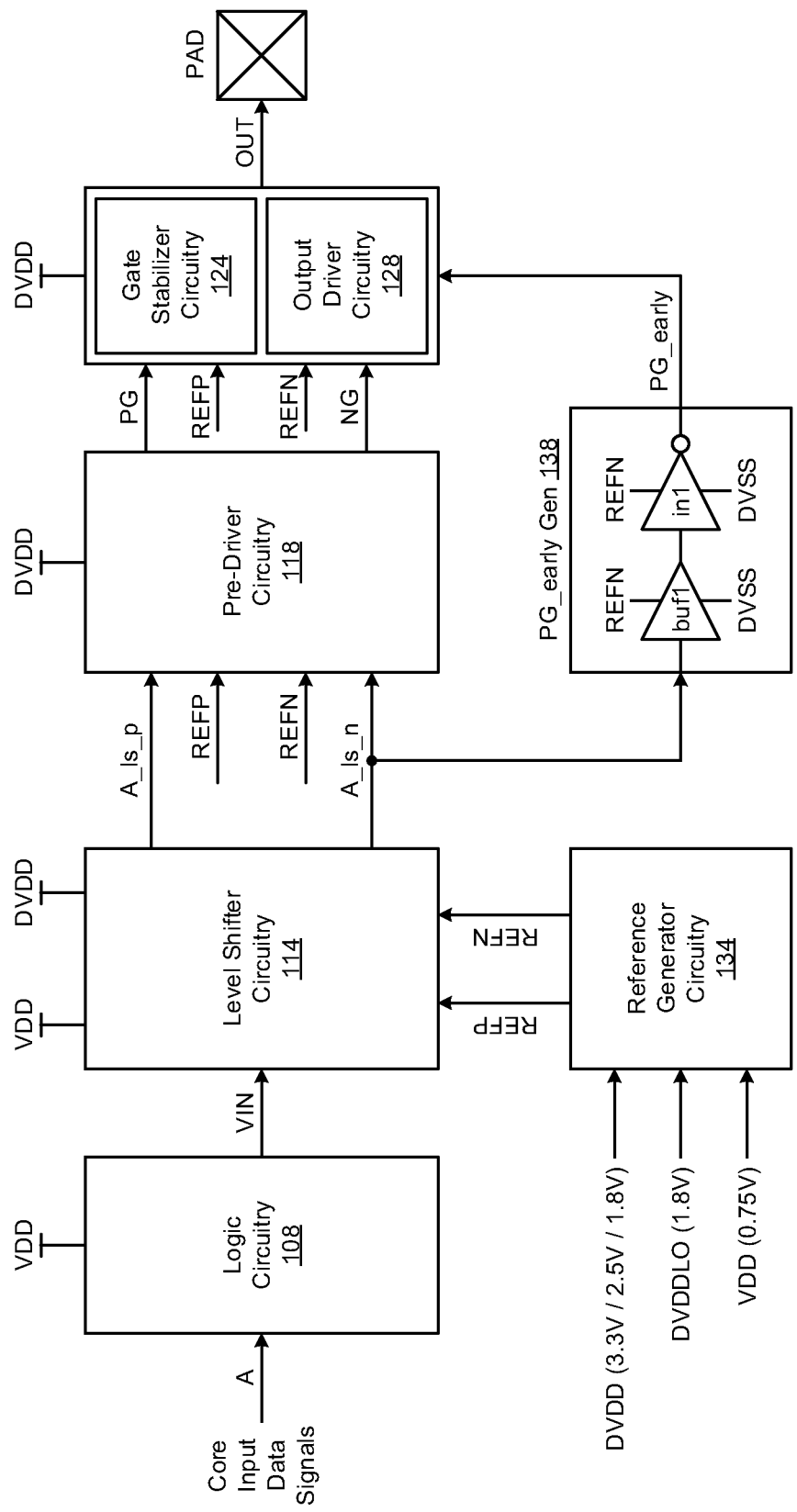
FIG. 1 illustrates a schematic diagram of overdrive input-output (IO) circuitry in accordance with various implementations described herein.

Various implementations described herein are directed to gate bias stabilization schemes and techniques that provides a novel overdrive input-output (IO) buffer with gate bias stabilizer for improved reliability, power and performance. For instance, the various schemes and techniques described herein may provide fail-safe/tolerant IO pad circuitry having an overdrive (IO) buffer with gate biasing stabilizer that operates to reduce IO pad coupling on gate bias for improved reliability, power and performance. In some instances, the overdrive IO buffer may support higher IO supply voltages using lower oxide devices, where gate biasing is needed for stacked PFET/NFET drivers. Also, the gate bias voltage may be generated from the IO supply itself with a DC current, and while pad switching occurs at high frequencies, gate bias signals may be coupled to the IO pad when overshoots and/or undershoots occur. In some situations, these undershoots and/or overshoots may cause duty-cycle distortion at the IO pad and voltage stress on various devices coupled to the IO pad with these bias signals. As such, the various gate bias stabilization schemes and techniques described herein may be used to dynamically couple these bias signals during pad switching so as to suppress overshoot/undershoot on the bias signals. Thus, in some scenarios, the various gate bias stabilization schemes and techniques described herein may be used to also reduce reference voltage generation current and also reduce voltage stress to thereby improve the duty-cycled output at the IO pad.

In some scenarios, for some operating conditions, various related circuitry may operate with supply voltage (DVDD) of approximately 3.3V, and in other instances, under fail-safe operating conditions, various circuitry may operate with a supply voltage (DVDD) of 0V and with an intermediate voltage supply (DVDDLO) of 0V. In this instance, the IO circuitry should be in Hi-Z state when power (DVDD, DVDDLO)=0, and/or when the pad is driven externally with various supply voltage levels, such as 3.3V or 2.5V or 1.8V, and in other instances, under tolerant operating conditions, various circuitry may operate with supply voltage (DVDD) of 1.8V or 2.5V and with intermediate voltage supply (DVDDLO) of 1.8V, and the pad may be driven externally with various supply voltage levels, such as 3.3V/2.5V or 3.3V. In this instance, the IO output circuitry should be in Hi-Z state.

Thus, various implementations described herein provide gate bias stabilization under normal operation and under fail-safe/tolerant operation. Various implementations described herein may also provide gate bias stabilization circuitry that utilizes low voltage devices, such as, e.g., 1.8V devices, for some circuitry that operate with power sequence independent fail-safe/tolerant support with different voltage level domains, such as, e.g., 3.3V/2.5V/1.8V). Advantages of using the gate bias stabilization schemes and techniques described herein may provide for overdrive (e.g., 3.3V/2.5V/1.8V) fail-safe and/or tolerant support when using 1.8V devices, multi-voltage domain fail-safe/tolerant support and/or high-speed fail-safe/tolerant support for various applications that involve power sequence independence and related operational conditions.

Various implementations of gate bias stabilization schemes and techniques will be described in detail herein with reference to FIGS. 1-3.

FIG. 1 illustrates a diagram 100 of overdrive input-output (IO) circuitry 104 in accordance with various implementations described herein.

In various implementations, the overdrive IO circuitry 104 may be implemented as a system or device having various integrated circuit (IC) components that are arranged and coupled together as an assemblage or combination of parts that provide for a physical circuit design and related structures. In some instances, a method of designing, providing and building the overdrive IO circuitry 104 as an integrated system or device may involve use of various IC circuit components described herein so as to implement various gate bias stabilization techniques associated therewith. The overdrive IO circuitry 104 may be integrated with various computing circuitry and related components on a single chip, and the overdrive IO circuitry 104 may be implemented in embedded systems for electronic, mobile and Internet-of-things (IoT) applications, including remote sensor nodes.

As shown in FIG. 1, the overdrive IO circuitry 104 may have logic circuitry 108 that receives one or more core input data signals (A) and provides an Input signal (VIN) to level shifter circuitry 114 based on the one or more core input data signals (A). The logic circuitry 108 may be coupled to the supply voltage (VDD). The overdrive IO circuitry 104 may have level shifter circuitry 114 that receives other voltages, such as, e.g., reference voltages (REFP, REFN), from reference generator circuitry 134 and then provides level-shifted input voltages (A_ls_p, A_ls_n) based on reference voltages (REFP, REFN). The level-shifted input voltages (A_ls_p, A_ls_n) may refer to level shifted core input data signals that are generated and provided based on the reference signals (REFP, REFN). The reference generator circuitry 134 may provide the reference voltages (REFP, REFN) directly to the level shifter circuitry 114, the pre-driver circuitry 118, the gate stabilizer circuitry 124 and the output driver circuitry 128.

The overdrive IO circuitry 104 may have pre-driver circuitry 118 that receives the level-shifted input voltages (A_ls_p, A_ls_n), receives reference voltages (REFP, REFN) and provides gate voltages (PG, NG) based on the level-shifted input voltages (A_ls_p, A_ls_n) and reference voltages (REFP, REFN). The overdrive IO circuitry 104 may have gate stabilizer circuitry 124 that receives the reference voltages (REFP, REFN) and provides a stabilized reference voltage (e.g., stabilized REFP reference voltage) based on the reference voltages (REFP, REFN). The overdrive IO circuitry 104 may have output driver circuitry 128 that receives reference voltages (REFP, REFN), receives gate voltages (PG, NG), receives stabilized reference voltage (e.g., stabilized REFP voltage) and provides output pad voltage (OUT) to input-output pad (PAD) based on the reference voltages (REFP, REFN), gate voltages (PG, NG) and stabilized reference voltage (e.g., stabilized REFP voltage).

In some implementations, the overdrive IO circuitry 104 may have the reference generator circuitry 134 that receives one or more supply voltages (VDD, DVDD, DVDDLO) and provides the reference voltages (REFP, REFN) to the level shifter circuitry 114 based on the one or more supply voltages (VDD, DVDD, DVDDLO). The level shifter circuitry 114 may be configured to operate in a first voltage domain (e.g., VDD) that is associated with different voltage levels between 0V and 0.75V. The level shifter circuitry 114 may be configured to operate in a second multi-voltage domain (e.g., DVDD) that is associated with different voltage levels related to one or more of 1.8V, 2.5V and 3.3V. Also, the level shifter circuitry 114 may be configured to provide the level-shifted input voltages (A_ls_p, A_ls_n).

In some implementations, the pre-driver circuitry 118 may have a first pre-driver and a second pre-driver that separately receive level-shifted input voltages (A_ls_p, A_ls_n) from the level shifter circuitry 114 and reference voltages (REFP, REFN) from the reference generator circuitry 134 then provide the gate voltages (PG, NG) based on level-shifted input voltages (A_ls_p, A_ls_n) and reference voltages (REFP, REFN). Also, in some instances, the level-shifted input voltages (A_ls_p, A_ls_n) may refer to level shifted core input data signals that may be generated and provided based on the reference signals (REFP, REFN).

In some implementations, the overdrive IO circuitry 104 may have PG_early generation circuitry (PG_early Gen) 138 that may receive at least one of the level shifted reference voltages (e.g., A_ls_n) and provide a control signal, such as, e.g., the PG_early voltage signal, to the gate stabilizer circuitry 124. In some instances, the PG_early Gen circuitry 138 may include one or more buffers or inverters (e.g., buf1, in1) that are coupled in series between the level shifter circuitry 114 and the gate stabilizer circuitry 124. Thus, in some instances, the series-coupled inventors (buf1, in1) may receive the A_ls_n signal from the level shifter circuitry 114 and provide the PG_early signal to the gate stabilizer circuitry 124 based on the A_ls_n signal.

Figure 2A:
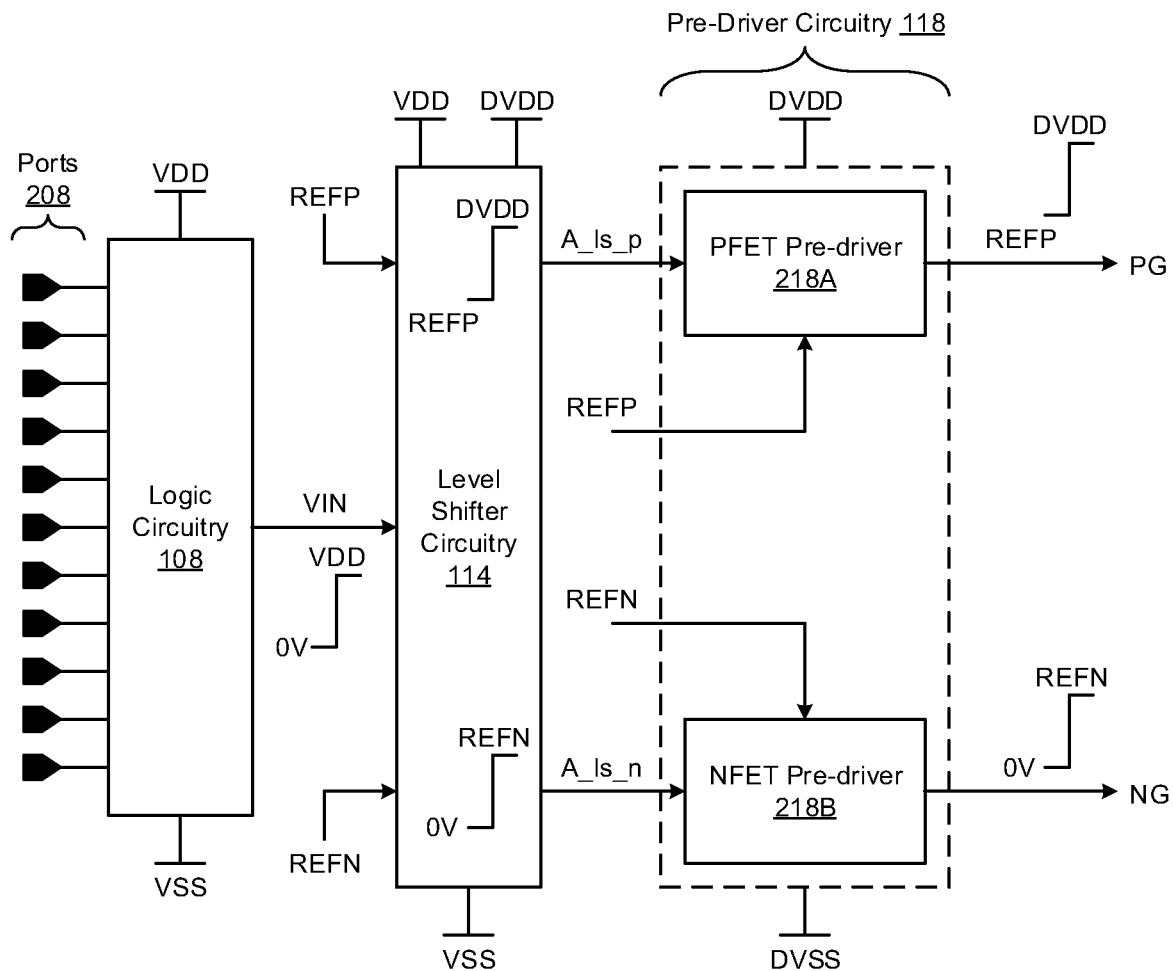
FIGS. 2A-2B illustrate various diagrams of overdrive input-output (IO) circuitry in accordance with various implementations described herein.
Figure 2B:
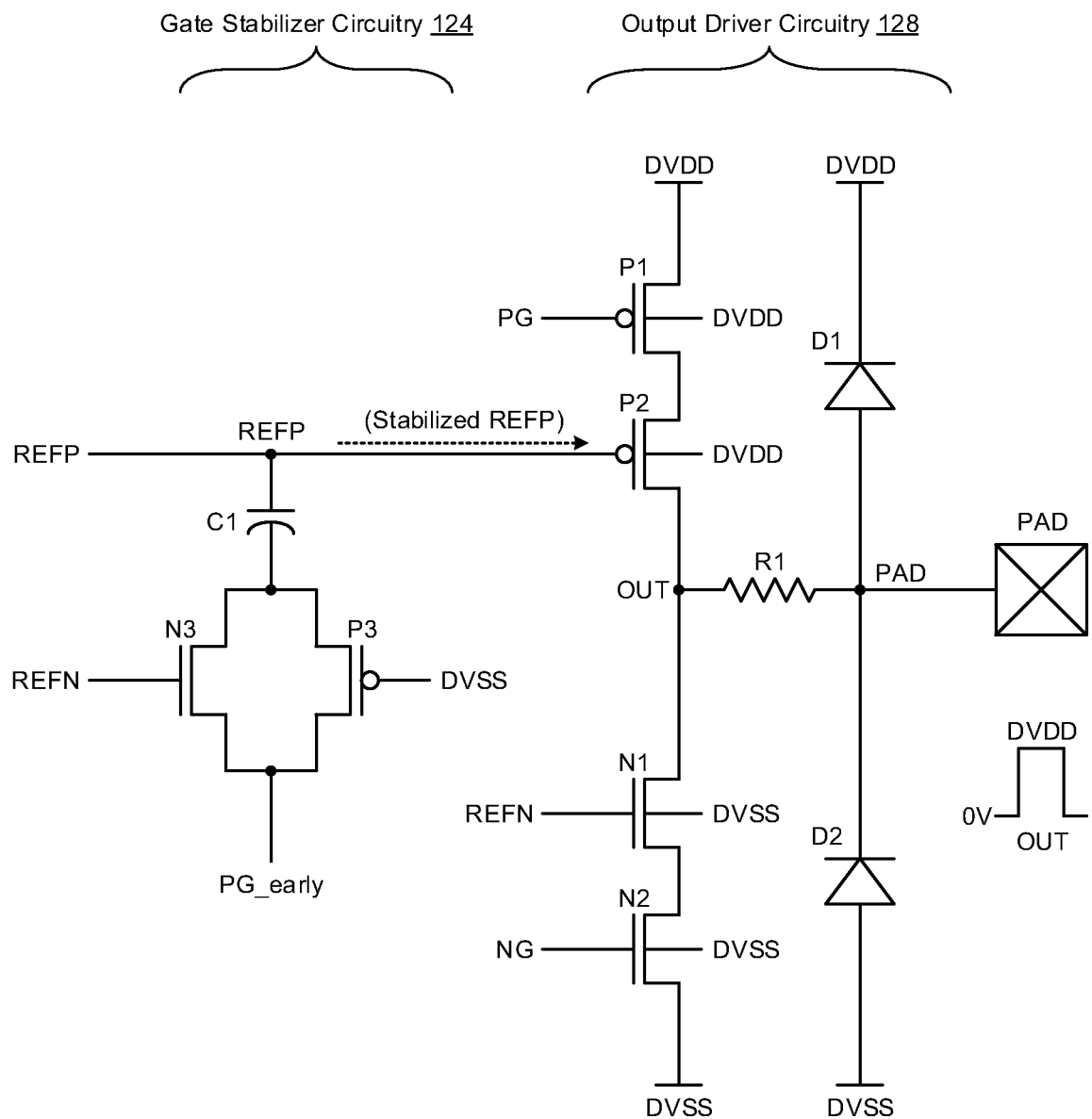

FIGS. 2A-2B illustrate various diagrams of overdrive input-output (IO) circuitry 204A, 204B in accordance with various implementations described herein. In particular, FIG. 2A shows a diagram of overdrive input-output (IO) circuitry 204A, and FIG. 2B shows a diagram of overdrive input-output (IO) circuitry 204B. Also, FIGS. 2A-2B may be combined to provide a more detailed view of overdrive IO circuitry 104 in FIG. 1.

In various implementations, the overdrive IO circuitry 204A, 204B as shown in FIGS. 2A-2B may be implemented as a system or a device with various integrated circuit components that are arranged and coupled together as an assemblage or combination of parts that provide for a physical circuit design and related structures. In some instances, a method of designing, providing and building the overdrive IO circuitry 204A, 204B as an integrated system or device involves use of various circuit components described herein so as to implement various gate bias stabilization techniques associated therewith. Also, the overdrive IO circuitry 204A, 204B may be integrated with various computing circuitry and related components on a single chip, and the overdrive IO circuitry 204A, 204B may be implemented in embedded systems for electronic, mobile and Internet-of-things (IoT) applications, including remote sensor nodes.

As shown in FIG. 2A, the overdrive IO circuitry 204A may have various circuits and/or components including logic circuitry 108 and level shifting circuitry 114. Also, the logic circuitry 108 may have one or more input ports 208 that are configured to receive one or more core signals from internal sources and/or external sources. In various instances, the internal sources may refer to on-chip circuitry associated with the chip-level circuitry, such as, e.g., a digital core and/or the analog core, and also, the external sources may refer to off-chip devices that are external to chip-level circuitry. In various instances, the logic circuitry 108 may be coupled to a first voltage domain, such as, e.g., a core voltage domain that may be configured to provide a core supply voltage (VDD) and a core ground supply voltage (VSS). Also, in some instances, one or more components of the overdrive IO circuitry 204A, such as, e.g., the level shifting circuitry 114, may be coupled to the first voltage domain and/or a second voltage domain, such as, e.g., an IO voltage domain that is different than the first voltage domain and that may be configured to provide IO supply voltage (DVDD) and IO ground supply voltage (DVSS).

In some implementations, the logic circuitry 108 may be coupled between core supply voltages (VDD, VSS), and the level shifter circuitry 114 may be coupled between IO supply voltages (DVDD, DVSS) and/or core supply voltages (VDD, VSS). Also, the pre-driver circuitry 214 may be coupled between IO supply voltages (DVDD, DVSS), and the logic circuitry 108 may be configured to receive one or more core signals via the one or more input ports 208 and provide input signal (VIN) to the level shifting circuitry 114. Also, in some instances, the level shifting circuitry 114 may operate as a level shifter configured to receive the input signal (VIN) from the logic circuitry 108 and provide the level shifted input voltages (A_ls_p, A_ls_n) based on the IO voltage (DVDD).

In various implementations, the pre-driver circuitry 118 may have multiple pre-drivers including, e.g., a first pre-driver 218A and a second pre-driver 218B that separately receive the level-shifted input voltages (A_ls_p, A_ls_n) from the level shifter circuitry 114, receive the reference voltages (REFP, REFN) from the reference generator circuitry 134) and provide the gate voltages (PG, NG) based on the level-shifted input voltages (A_ls_p, A_ls_n) and reference voltages (REFP, REFN). Therefore, in various instances, the reference generator circuitry 134 in FIG. 1 may be configured to provide the reference voltages (REFP, REFN) to the level shifter circuitry 114, the pre-drivers 218A, 218B, the gate stabilizer circuitry 124 and the output driver circuitry 128. Also, in some instances, the first pre-driver 218A may be referred to as a p-based (or PFET-based) pre-driver, and the second pre-driver 218B may be referred to as an n-based (or NFET-based) pre-driver.

As shown in FIG. 2B, the overdrive IO circuitry 204B may have various circuits and/or components including the gate stabilizer circuitry 124 and the output driver circuitry 128 that are coupled together to receive input signals (e.g., PG, REFP, REFN, NG) and provide the output pad voltage (OUT) to the IO pad (PAD). As described herein, the early gate voltage generator (PG_early Gen) 138 in FIG. 1 receives at least one of the level-shifted reference voltages (e.g., A_ls_n) from the level shifter circuitry 114 and provides the early gate voltage (PG_early) to the gate stabilizer circuitry 124.

In some implementations, the gate stabilizer circuitry 124 may receive the early gate voltage (PG_early), receive the reference voltages (REFP, REFN) and then provide the stabilized reference voltage (e.g., a stabilized REFP voltage) based on the early gate signal (PG_early) and the reference voltages (REFP, REFN). The gate stabilizer circuitry 124 may have transistors (N3, P3) including, e.g., a first transistor (N3) coupled in parallel with a second transistor (P3) between the output driver circuitry 128 and early gate voltage generator circuitry (PG_early Gen) 138 in FIG. 1. Also, the gate stabilizer circuitry 124 may include a capacitor (C1) that is coupled between the parallel-coupled transistors (N3, P3) and the output driver circuitry 128. The first transistor (N3) may be activated by at least one of the reference voltages (e.g., REFN), and the second transistor (P3) may have its gate coupled to ground (e.g., DVSS). Also, in some instances, during operation, the gate stabilizer circuitry 124 may receive the REFP signal and provide a stabilized REFP signal to the gate of transistor (P2) in the output driver circuitry 128.

In some implementations, the output driver circuitry 128 has multiple transistors (P1, P2, N1, N2) including a first transistor (P1), a second transistor (P2), a third transistor (N1) and a fourth transistor (N2) that a coupled in series between supply voltage (DVDD) and ground (DVSS). In some instances, the first transistor (P1) may be coupled between the supply voltage (DVDD) and the second transistor (P2), and also, the second transistor (P2) may be coupled between the first transistor (P1) and the third transistor (N1). Also, the third transistor (N1) may be coupled between the second transistor (P2) and the fourth transistor (N2), and the fourth transistor (N2) may be coupled between the third transistor (N1) and ground (DVSS). Also, the input-output (10) pad (PAD) may be coupled to a node (OUT) disposed between the second transistor (P2) and the third transistor (N1), and the input-output (IO) pad (PAD) couples to the supply voltage (DVDD) when the first transistor (P1) and the second transistor (P2) are activated and also when at least one of the third transistor (N1) and the fourth transistor (N2) are deactivated. Also, the input-output (IO) pad (PAD) couples to ground (DVSS) when at least one of the first transistor (P1) and the second transistor (P2) are deactivated and when the third transistor (N1) and the fourth transistor (N2) are activated. In some instances, the input-output (IO) pad (PAD) charges to the supply voltage (DVDD) when the first transistor (P1) and the second transistor (P2) are activated and when at least one of the third transistor (N1) and the fourth transistor (N2) are deactivated. Also, the input-output (IO) pad (PAD) discharges to ground (DVSS) when at least one of the first transistor (P1) and the second transistor (P2) are deactivated and when the third transistor (N1) and the fourth transistor (N2) are activated.

In some implementations, the output driver circuitry 128 may include the diode circuitry with one or more diodes, such as, e.g., a first diode (D1) and a second diode (D2) that are coupled in series between ground (DVSS) and supply voltage (DVDD). The first diode (D1) may be coupled between PAD node and supply voltage (DVDD), and also, the second diode (D2) may be coupled between ground (DVSS) and the PAD node. In some instances, a resistor (R1) may be coupled between the OUT node and the PAD node.

Figure 3:
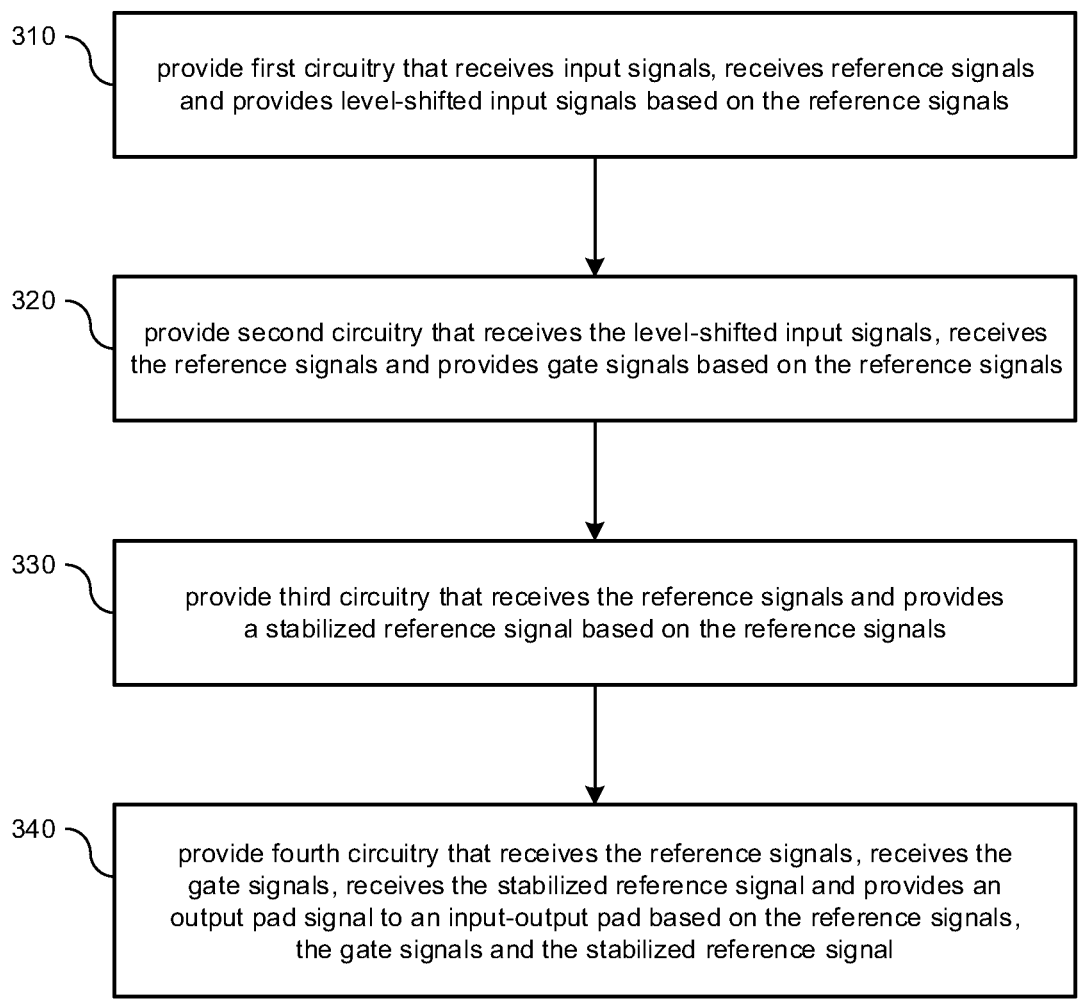
FIG. 3 illustrates a diagram of a method for providing gate bias stabilization for overdrive IO circuitry in accordance with implementations described herein.

FIG. 3 illustrates a process diagram of a method 300 for providing gate bias stabilization circuitry in accordance with various implementations described herein. Also, in some implementations, method 300 may be used to provide gate bias stabilization for overdrive input-output (IO) circuitry in various physical layout applications.

It should be understood that even though the method 300 indicates a particular order of operation execution, in some instances, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1 and 2A-2B. Also, if implemented in software, method 300 may be implemented with program and/or software instruction processes configured for providing gate bias stabilization techniques, as described herein. Also, if implemented in software, instructions related to implementing the method 300 may be stored in memory and/or a database. In various instances, a computer or various other types of computing devices having a processor and memory may be configured to perform method 300.

In various implementations, method 300 may refer to a method of designing, providing, building and/or manufacturing gate bias stabilization circuitry as an integrated system, device and/or circuit that may involve use of the various IC circuit components described herein so as to thereby implement gate bias stabilization techniques associated therewith. The gate bias stabilization circuitry may be integrated with computing circuitry and related components on a single chip, and the gate bias stabilization circuitry may be implemented in various embedded systems for various electronic, mobile and Internet-of-things (IoT) applications, including sensor nodes.

At block 310, method 300 may provide first circuitry (e.g., level shifter circuitry) that is configured to receive reference signals and provide level-shifted reference signals based on the reference signals. At block 320, method 300 may provide second circuitry (e.g., pre-driver circuitry) that is configured to receive the level-shifted reference signals and provide gate signals based on the level-shifted signals. At block 330, method 300 may provide third circuitry (e.g., gate stabilizer circuitry) that is configured to receive the reference signals and provide a stabilized reference signal (e.g., stabilized p-based gate signal) based on the reference signals. Moreover, at block 340, method 300 may provide fourth circuitry (e.g., output driver circuitry) that is configured to receive the reference signals, receive the gate signals, receive the stabilized reference signal and then provide an output pad signal to an input-output (IO) pad based on the reference signals, the gate signals and/or the stabilized reference signal.

In some implementations, method 300 may provide a reference generator (e.g., reference generator circuitry) that is configured to receive one or more supply voltages (e.g., VDD, DVDD, DVDDLO) and provide the reference voltages based on the one or more supply voltages. The pre-driver circuitry may include a first pre-driver and a second pre-driver that separately receive the level-shifted reference voltages from the level shifter circuitry and provide the gate voltages based on the level-shifted voltages.

The level shifter circuitry may operate in a first voltage domain associated with different voltage levels between 0V and 0.75V. The level shifter circuitry may operate in a second multi-voltage domain associated with different voltage levels related to one or more of 1.8V, 2.5V and 3.3V. The level shifter circuitry may be configured to level-shift the reference voltages between the first voltage domain and the second voltage domain so as to thereby provide the level-shifted reference voltages.

Also, in some implementations, method 300 may provide an early gate voltage generator (e.g., early gate voltage generator circuitry) that is configured to receive at least one of the level-shifted reference voltages from the level shifter and provide an early gate voltage to the gate stabilizer circuitry. The gate stabilizer circuitry is configured to receive the early gate voltage, receive the reference voltages and provide the stabilized reference voltage based on the early gate signal and/or the reference voltages. The gate stabilizer circuitry may have transistors including a first transistor coupled in parallel with a second transistor between output driver circuitry and early gate voltage generator circuitry, and the gate stabilizer may have at least one capacitor coupled between the transistors and output driver circuitry. The first transistor may be activated by at least one of the reference voltages, and the second transistor may have its gate coupled to ground.

Also, in some implementations, the output driver circuitry may have transistors including a first transistor, a second transistor, a third transistor and a fourth transistor that are coupled together in series between a supply voltage and ground. The first transistor may be coupled between the supply voltage and the second transistor, and the second transistor may be coupled between the first transistor and the third transistor. The third transistor may be coupled between the second transistor and the fourth transistor, and the fourth transistor may be coupled between the third transistor and ground.

Also, in some implementation, the input-output pad may be coupled to a node disposed between the second transistor and the third transistor. In some instances, the input-output pad may couple to the supply voltage when the first transistor and the second transistor are activated and when at least one of the third transistor and fourth transistor are deactivated. Also, the input-output pad may couple to ground when at least one of the first transistor and the second transistor are deactivated and when the third transistor and the fourth transistor are activated.

In some instances, the input-output pad charges to the supply voltage when the first transistor and the second transistor are activated and when at least one of the third transistor and the fourth transistor are deactivated. Also, the input-output pad discharges to ground when at least one of the first transistor and the second transistor are deactivated and when the third transistor and the fourth transistor are activated.

Various implementations described herein are directed to gate bias stabilization schemes and techniques that may provide various advantages. For instance, overdrive operation (e.g., 3.3V/2.5V/1.8V) may include fail-safe support using 1.8V devices, wherein overdrive operation is 1.8V tolerant to 3.3V/2.5V, and wherein overdrive operation is also 2.5V tolerant to 3.3V. Also, the gate bias stabilization schemes and techniques described herein may provide power sequence independent circuitry with high speed fail-safe cum tolerant support in various overdrive related applications.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a level shifter that receives an input signal and reference voltages and provides level-shifted input signals based on the reference voltages. The device may have a pre-driver that receives the level-shifted input signals and reference voltages and provides gate voltages based on the reference voltages. The device may have a gate stabilizer that receives the reference voltages and provides a stabilized reference voltage based on the reference voltages. The device may have an output driver that receives the reference voltages, receives the gate voltages, receives the stabilized reference voltage and provides an output pad voltage to an input-output pad based on the reference voltages, the gate voltages and the stabilized reference voltage.

Described herein are various implementations of a device having a level shifter that receives a p-based reference signal and an n-based reference signal and provides a level-shifted p-based input signal and a level-shifted n-based input signal. The device may have a pre-driver that receives the level-shifted p-based input signal and the level-shifted n-based input signal and p-based reference signal and n-based reference signal and provides a p-based gate signal and an n-based gate signal. The device may have a gate stabilizer that receives the reference signals and the level-shifted n-based input signal and provides a stabilized p-based reference signal. The device may have an output driver that receives the p-based reference signal, the n-based reference signal, the p-based gate signal, the n-based gate signal, and the stabilized p-based reference signal and provides an output pad voltage to an input-output pad.

Described herein are various implementations of a method. The method may provide first circuitry that receives input signals, receives reference signals and provides level-shifted input signals based on the reference signals. The method may provide second circuitry that receives the level-shifted input signals, receives the reference signals and provides gate signals based on the reference signals. The method may provide third circuitry that receives the reference signals and provides a stabilized A-based reference signal based on the reference signals. The method may provide fourth circuitry that receives the reference signals, receives the gate signals, receives the stabilized p-based reference signal and provides an output pad signal to an input-output pad based on the reference signals, the gate signals and the stabilized p-based reference signal.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device comprising:
a level shifter that receives an input signal and reference voltages and provides level-shifted input signals based on the reference voltages;
a pre-driver that receives the level-shifted input signals and reference voltages and provides gate voltages based on the reference voltages;
a gate stabilizer that receives the reference voltages and provides a stabilized reference voltage based on the reference voltages; and
an output driver that receives the reference voltages, receives the gate voltages, receives the stabilized reference voltage and provides an output pad voltage to an input-output pad based on the reference voltages, the gate voltages and the stabilized reference voltage.

2. The device of claim 1, further comprising:
a reference generator that receives one or more supply voltages and provides the reference voltages based on the one or more supply voltages.

3. The device of claim 1, wherein:
the level shifter operates in a first voltage domain associated with different voltage levels between 0V and 0.75V,
the level shifter further operates in a second multi-voltage domain associated with different voltage levels related to one or more of 1.8V, 2.5V and 3.3V, and
the level shifter is configured to level-shift the input voltages between the first voltage domain and the second voltage domain so as to thereby provide the level-shifted input voltages.

4. The device of claim 1, wherein:
the pre-driver has a first pre-driver and a second pre-driver that separately receive the level-shifted input voltages from the level shifter and reference voltages from a reference generator and provide the gate voltages based on the level-shifted input voltages and the reference voltages.

5. The device of claim 1, further comprising:
early gate voltage generator that receives at least one of the level-shifted input voltages from the level shifter and provides an early gate voltage to the gate stabilizer,
wherein the gate stabilizer receives the early gate voltage, receives the reference voltages and provides the stabilized reference voltage based on the early gate signal and the reference voltages.

6. The device of claim 5, wherein:
the gate stabilizer has transistors including a first transistor coupled in parallel with a second transistor between the output driver and the early gate voltage generator, and
the gate stabilizer has a capacitor coupled between the transistors and the output driver.

7. The device of claim 6, wherein:
the first transistor is activated by at least one of the reference voltages, and
the second transistor has its gate coupled to ground.

8. The device of claim 1, wherein:
the output driver has a first transistor, a second transistor, a third transistor and a fourth transistor.

9. The device of claim 8, wherein:
the first transistor is coupled between a supply voltage and the second transistor, the second transistor is coupled between the first transistor and the third transistor, the third transistor is coupled between the second transistor and the fourth transistor, and the fourth transistor is coupled between the third transistor and ground.

10. The device of claim 9, wherein:

the input-output pad is coupled to a node disposed between the second transistor and the third transistor, the input-output pad couples to the supply voltage when the first transistor and the second transistor are activated and when at least one of the third transistor and the fourth transistor are deactivated, and the input-output pad couples to ground when at least one of the first transistor and the second transistor are deactivated and when the third transistor and the fourth transistor are activated.

11. The device of claim 9, wherein:

the input-output pad is coupled to a node disposed between the second transistor and the third transistor, the input-output pad charges to the supply voltage when the first transistor and the second transistor are activated and when at least one of the third transistor and the fourth transistor are deactivated, and the input-output pad discharges to ground when at least one of the first transistor and the second transistor are deactivated and when the third transistor and the fourth transistor are activated.

12. A device comprising:

a level shifter that receives a p-based reference signal and an n-based reference signal and provides a level-shifted p-based input signal and a level-shifted n-based input signal;

a pre-driver that receives the level-shifted p-based input signal and the level-shifted n-based input signal and p-based reference signal and n-based reference signal and provides a p-based gate signal and an n-based gate signal;

a gate stabilizer that receives the reference signals and the level-shifted n-based input signal and provides a stabilized p-based reference signal; and an output driver that receives the p-based reference signal, the n-based reference signal, the p-based gate signal, the n-based gate signal, and the stabilized A-based reference signal and provides an output pad voltage to an input-output pad.

13. The device of claim 12, wherein:

the stabilized p-based reference signal refers to a stabilized p-based reference signal, and the output driver receives the p-based reference signal as the stabilized p-based reference signal from the gate stabilizer.

14. The device of claim 12, further comprising:

a reference generator that receives one or more supply voltages and provides the p-based reference signal and the n-based reference signal based on the one or more supply voltages, wherein the level shifter receives the p-based reference signal and the n-based reference signal from the reference generator, wherein the pre-driver has a p-based pre-driver that receives the level-shifted A-based input signal from the level shifter and p-based reference signal from a reference generator and provides the p-based gate signal to the output circuitry, and wherein the pre-driver has an n-based pre-driver that receives the level-shifted n-based input signal from the level shifter and n-based reference signal from the reference generator and provides the n-based gate signal to the output circuitry.

15. The device of claim 12, further comprising:

early gate signal generator that receives at least one of the level-shifted input signals from the level shifter and provides an early gate signal to the gate stabilizer, wherein the gate stabilizer receives the early gate signal, receives the reference signals and provides a stabilized p-based reference signal based on the early gate signal and the reference signals.

16. The device of claim 15, wherein:

the gate stabilizer has transistors including a first transistor coupled in parallel with a second transistor between the output driver and the early gate signal generator, the gate stabilizer has a capacitor coupled between the transistors and the output driver, the first transistor is activated by at least one of the reference signals, and the second transistor has its gate coupled to ground.

17. The device of claim 12, wherein:

the output driver has transistors including a first transistor, a second transistor, a third transistor and a fourth transistor, the first transistor is coupled between a supply voltage and the second transistor, the second transistor is coupled between the first transistor and the third transistor, the third transistor is coupled between the second transistor and the fourth transistor, and the fourth transistor is coupled between the third transistor and ground.

18. The device of claim 17, wherein:

the input-output pad is coupled to a node disposed between the second transistor and the third transistor, the input-output pad couples to the supply voltage when the first transistor and the second transistor are activated and when at least one of the third transistor and the fourth transistor are deactivated, and the input-output pad couples to ground when at least one of the first transistor and the second transistor are deactivated and when the third transistor and the fourth transistor are activated.

19. The device of claim 17, wherein:

the input-output pad is coupled to a node disposed between the second transistor and the third transistor, the input-output pad charges to the supply voltage when the first transistor and the second transistor are activated and when at least one of the third transistor and the fourth transistor are deactivated, and the input-output pad discharges to ground when at least one of the first transistor and the second transistor are deactivated and when the third transistor and the fourth transistor are activated.

20. A method comprising:

providing first circuitry that receives input signals, receives reference signals and provides level-shifted input signals based on the reference signals;

providing second circuitry that receives the level-shifted input signals, receives the reference signals and provides gate signals based on the reference signals;

providing third circuitry that receives the reference signals and provides a stabilized p-based reference signal based on the reference signals; and providing fourth circuitry that receives the reference signals, receives the gate signals, receives the stabilized p-based reference signal and provides an output pad signal to an input-output pad based on the reference signals, the gate signals and the stabilized p-based reference signal.

\* \* \* \* \*